(12) United States Patent  (10) Patent No.: US 8,605,524 B2
Yoshida  (45) Date of Patent: *Dec. 10, 2013

(54) SEMICONDUCTOR DEVICE AND SEMICONDUCTOR MEMORY DEVICE

(71) Applicant: Elpida Memory, Inc., Tokyo (JP)

(72) Inventor: Soichiro Yoshida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/653,265

(22) Filed: Oct. 16, 2012

(65) Prior Publication Data
US 2013/0039136 A1  Feb. 14, 2013

Related U.S. Application Data

(63) Continuation of application No. 12/926,960, filed on Dec. 20, 2010, now Pat. No. 8,300,484.

(30) Foreign Application Priority Data

Dec. 21, 2009 (JP) ................................. 2009-289885

(51) Int. Cl.
G11C 7/00 (2006.01)
(52) U.S. Cl.
USPC ........................... 365/194; 365/211; 365/205

(58) Field of Classification Search
USPC ................. 365/194, 211, 205, 233.1, 185.13
See application file for complete search history.

(56) References Cited

U.S. PATENT DOCUMENTS

| 5,375,093 | A | 12/1994 | Hirano |
| 6,072,733 | A | 6/2000 | Advani |
| 6,567,326 | B2 | 5/2003 | Nakazato et al. |
| 7,551,501 | B2 * | 6/2009 | Kim et al. ...................... 365/211 |
| 8,300,484 | B2 * | 10/2012 | Yoshida ........................ 365/194 |

FOREIGN PATENT DOCUMENTS

| JP | 5-266658 A | 10/1993 |
| JP | 2002-56681 A | 2/2002 |

* cited by examiner

Primary Examiner — David Lam
(74) Attorney, Agent, or Firm — McGinn Intellectual Property Law Group, PLLC

(57) ABSTRACT

A semiconductor device includes a memory cell, a first bit line coupled to the memory cell, a second bit line, a first sense amplifier circuit including first and second transistors, the first transistor including a gate coupled to the first bit line, and the first and second transistors are coupled in series between the second bit line and a first voltage line, a temperature detection circuit configured to detect a temperature of the semiconductor device, and a control circuit configured to receive an output of the temperature detection circuit and supply a control signal to a gate of the second transistor.

20 Claims, 8 Drawing Sheets

SEMICONDUCTOR DEVICE AND SEMICONDUCTOR MEMORY DEVICE

The present application is a Continuation Application of U.S. patent application Ser. No. 12/926,960, filed on Dec. 20, 2010, which is based on and claims priority from Japanese patent application No. 2009-289885, filed on Dec. 21, 2009, the entire contents of which is incorporated herein by reference.

BACKGROUND OF THE INVENTION

1. Field of the Invention

The present invention relates to a semiconductor device provided with a sense amplifier amplifying a signal voltage read out from a memory cell to a bit line, and particularly relates to a semiconductor device employing hierarchical bit lines and hierarchical sense amplifiers.

2. Description of Related Art

A semiconductor memory device such as DRAM is provided with sense amplifies each amplifying a signal voltage read out from a memory cell through a bit line. With a recent increase in capacity of the semiconductor memory device, a configuration has been proposed as measures against an increase in the number of memory cells connected to the bit line, in which a bit line structure and a sense amplifier structure are hierarchical respectively (For example, refer to Patent References 1 and 2). A memory cell array having the hierarchical structure can employ single-ended sense amplifiers having a small circuit scale without using a differential type sense amplifier circuit. Data corresponding to "0" or "1" stored in a memory cell of the DRAM is read out to the single-ended sense amplifier and is converted into a drain current of a transistor, and the signal voltage changing in response to the drain current is detected by a latch circuit included in a subsequent global sense amplifier which is configured to determine whether the data is "0" or "1".

[Patent Reference 1] Japanese Patent Application Laid-open No. 2002-56681
[Patent Reference 2] Japanese Patent Application Laid-open No. H5-266658

Generally, data stored in the memory cell of the DRAM is lost mainly due to that charge stored in a capacitor of the memory cell leaks through a junction. Particularly, "High" data is written into the memory cell when accessing or refreshing the memory cell, the stored charge in the capacitor is decreased with time. The leak of the stored charge in the memory cell of the DRAM generally has a temperature dependence and tends to become larger at a high temperature than at a low temperature. Thereby, in the above configuration having the hierarchical sense amplifiers, current ability becomes lower at the high temperature than at the low temperature, which causes the signal voltage inputted to the latch circuit of the above global sense amplifier to change slowly. As a result, there arises a problem that latch timing of the latch circuit has come before the signal voltage sufficiently changes so as to cause false latching. Further, this problem becomes significant particularly when reading "High" data at the high temperature, and thus read margin of the "High" data decreases at the high temperature. Therefore, there arise a problem that read margins of "High" data and "Low" data cannot be kept balanced. Conventionally, the configuration of the single-ended sense amplifier has been widely known (for example, see Patent Reference 1), and a circuit configuration for detecting the temperature in the DRAM has been known (for example, see Patent Reference 2). However, a configuration capable of dealing with the above-mentioned problems caused by the temperature dependence of the leak in the memory cell has not been known yet.

SUMMARY

The present invention seeks to solve one or more of the above problems, or to improve upon those problems at least in part.

One of aspects of the invention is a semiconductor memory device comprising: a memory cell, a first bit line coupled to the memory cell, a second bit line, a first sense amplifier circuit including first and second transistors, the first transistor including a gate coupled to the first bit line, and the first and second transistors are coupled in series between the second bit line and a first voltage line, a temperature detection circuit configured to detect a temperature of the semiconductor device, and a control circuit configured to receive an output of the temperature detection circuit and supply a control signal to a gate of the second transistor.

The above configuration of the invention allows the semiconductor device to prevent failures such as false latching or the like by changing the control period of the sense amplifier corresponding to a change in ability of the sense amplifier due to temperature change.

According to the present invention, an activation period of hierarchical sense amplifiers is controlled to be appropriately changed in accordance with a temperature in order to prevent failure of a sensing operation due to a temperature dependence. In such a control, particularly when leak of stored charge of a capacitor increases at a high temperature, the sense amplifier needs a long time to amplify required data, and thus it is possible to reliably prevent false latching by prolonging the activation period. Further, it is possible to keep margins balanced when reading respective "High" and "Low" data from a memory cell, thereby improving reliability of a reading operation.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

A typical example of a technical idea solving the problems of the present invention will be shown below.

The present invention can be applied to a semiconductor memory device such as DRAM, which has memory cells and sense amplifiers reading data of the memory cells and changes an operating period of the sense amplifiers in accordance with a change in ability of the sense amplifiers when so-called PVT fluctuation (fluctuations of process, voltage and temperature) occurs.

In the following, a typical embodiment of the invention will be shown. However, the present invention is not limited to the following embodiment and can be widely applicable based on the scope of the claimed invention. In the embodiment, the present invention will be applied to a DRAM (Dynamic Random Access Memory) as the semiconductor memory device in which hierarchical bit lines and hierarchical sense amplifiers are employed and a single-ended sense amplifier circuit is provided.

Figure 1:
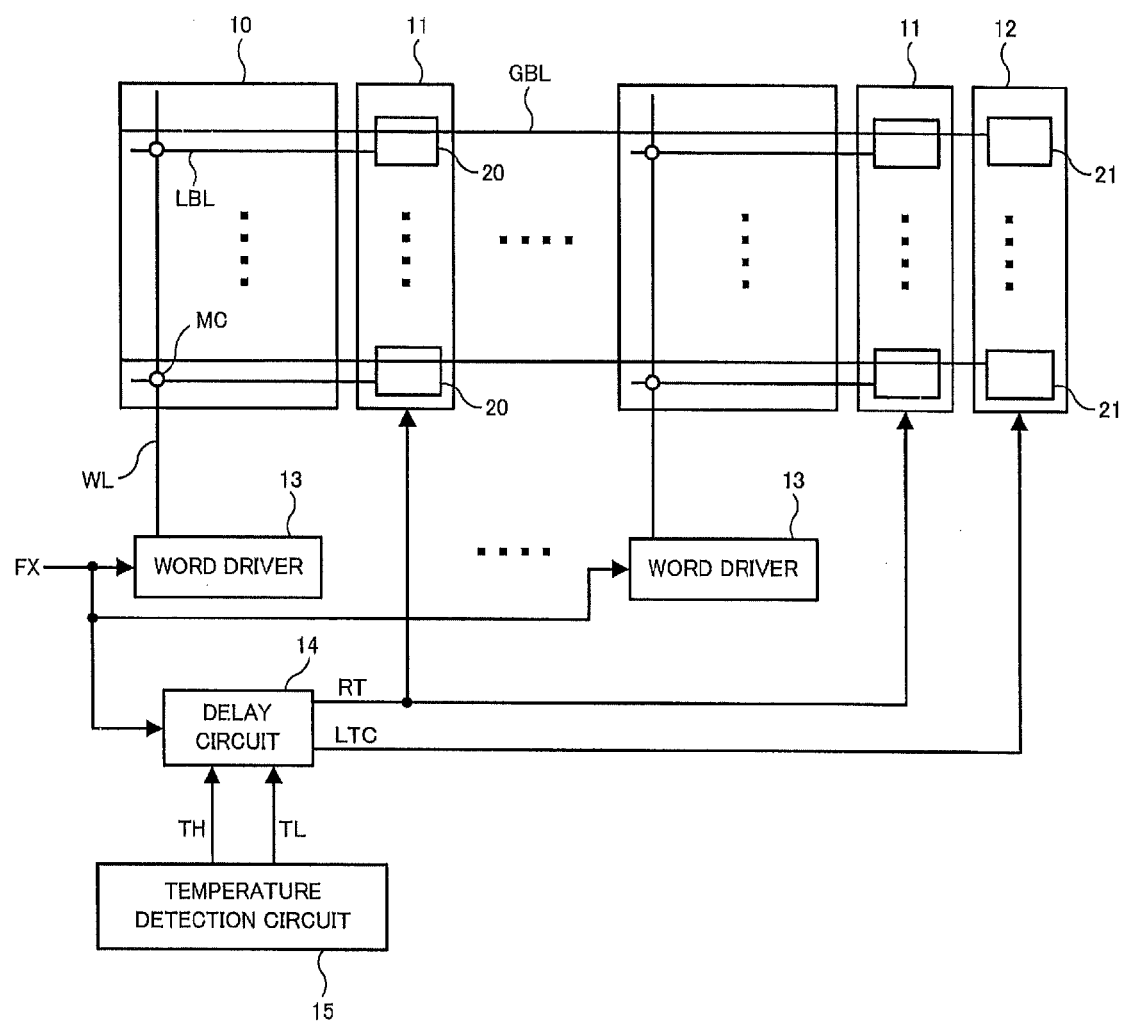
FIG. 1 is a block diagram showing an entire configuration of column circuits in a DRAM of an embodiment.

FIG. 1 is a block diagram mainly showing an entire configuration of column circuits in the DRAM of the embodiment. In the block diagram of FIG. 1, a plurality of memory cell arrays 10, a plurality of sense amplifier rows 11 attached to the respective memory cell arrays 10, a global sense amplifier row 12 arranged at one end of the plurality of memory cell arrays 10, a plurality of word drivers 13 attached to the respective memory cell arrays 10, a delay circuit 14, and a temperature detection circuit 15 are shown. In addition, the delay circuit 14 and the temperature detection circuit 15 function as part of the sense amplifier control circuit of the invention.

In each of the memory cell arrays 10, a plurality of word lines WL and a plurality of local bit lines LBL (the first bit lines of the invention) intersecting the word lines WL are arranged and a plurality of memory cells MC are formed at intersections thereof. A plurality of sense amplifiers 20 (the first sense amplifiers of the invention) are arranged in each of the sense amplifier row 11 adjacent to the memory cell array 10. Each local bit line LBL of the memory cell array 10 is connected to each sense amplifier 20 included in the sense amplifier row 11. A word line WL selected in the memory cell array 10 is driven by the word driver 13, and a signal voltage is read out from a corresponding memory cell MC to a pair of local bit lines LBL. The sense amplifier 20 connected to the local bit line LBL senses and amplifies the signal voltage of the local bit lines LBL.

One pair of a memory cell array 10 and a sense amplifier row 11 which are adjacent to each other are repeatedly arranged in a bit line extending direction, and one global sense amplifier row 12 is arranged at one end of the arrangement. In the example of FIG. 1, N memory cell arrays 10 and N sense amplifier rows 11 are alternately aligned in the bit line extending direction. A plurality of global sense amplifiers 21 (the second the sense amplifiers of the invention) are arranged in the global sense amplifier row 12. Each global bit line GBL (the second bit line of the invention) extends over the N memory cell arrays 10 and the N sense amplifier rows 11 and is selectively connected to N sense amplifiers 20 aligned in the bit line direction. As described above, hierarchical bit lines and hierarchical sense amplifiers are employed in the DRAM of the embodiment.

Each of the word drivers 13 receives a word line driving signal FX, and a selected word line WL in a corresponding memory cell array 10 is driven the word driver 13 in response to the word line driving signal FX. Also, the delay circuit 14 receives the word line driving signal FX. The delay circuit 14 outputs a control signal RT (the first control signal of the invention) and a control signal LTC (the second control signal of the invention), to each of which a delay time is given based on a temperature detection signal TH (the first temperature detection signal of the invention) and a temperature detection signal TL (the second temperature detection signal of the invention) both outputted from the temperature detection circuit 15 for the received word line driving signal FX. The temperature detection circuit 15 detects a binary temperature in an operation of the memory cell array 10 based on a well-known circuit configuration and generates the temperature detection signal TH which is enabled at a high temperature and the temperature detection signal TL which is enabled at a low temperature. The control signal RT outputted from the delay circuit 14 is used to control an activation period of each sense amplifier 20 of the sense amplifier row 11, and the control signal LTC outputted from the delay circuit 14 is used to control an activation period of each global sense amplifier 21 of the global sense amplifier row 12. A circuit configuration of the delay circuit 14 and a specific control using the control signals RT and LTC will be described in detail later.

Figure 2:
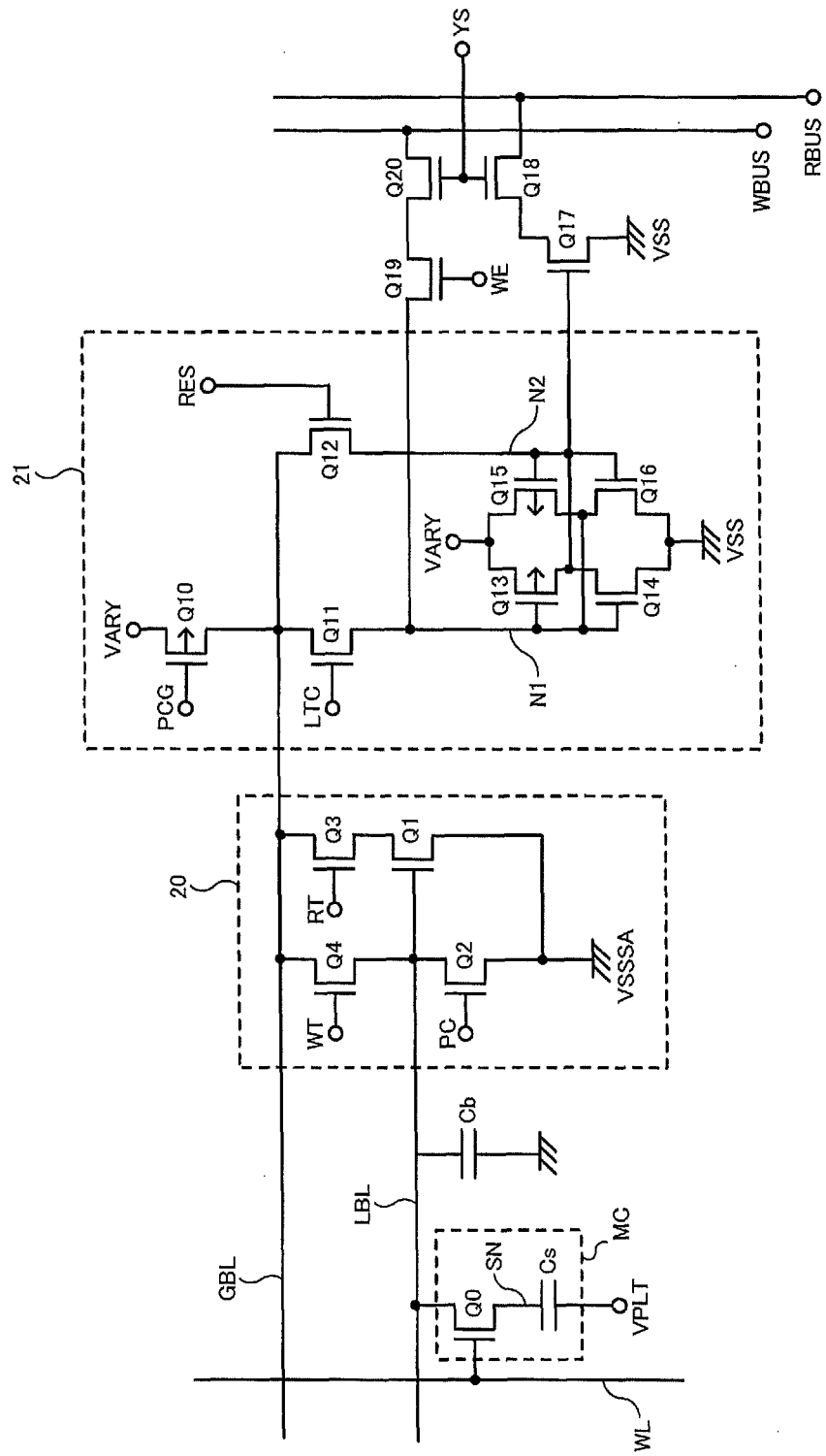
FIG. 2 is a diagram showing a specific circuit configuration related to hierarchical bit lines and hierarchical sense amplifiers in the DRAM of the embodiment.

Next, FIG. 2 shows a specific circuit configuration related to the hierarchical bit lines and the hierarchical sense amplifiers in the DRAM of the embodiment. The circuit configuration of FIG. 2 corresponds to a range including one word line WL and one local bit line LBL, one memory cell MC arranged at an intersection thereof, one sense amplifier 20, one global bit line GBL, one global sense amplifier 21, and a pair of a read bus RBUS and a write bus WBUS, respectively, as included in the block diagram of FIG. 1.

The Memory cell MC is composed of an N-channel type MOS (Hereinafter, referred to as NMOS) transistor Q0 and a capacitor Cs. The NMOS transistor Q0 has a gate connected to the word line WL, a source connected to the local bit line LBL, and a drain connected to one terminal of the capacitor Cs. The other terminal of the capacitor Cs is connected to a line of a cell plate voltage VPLT. Further, a bit line capacitance Cb is formed at the local bit line LBL. Although one memory cell MC is only shown in FIG. 2, a large number of memory cells MC are actually connected to one local bit line LBL and thus the value of the bit line capacitance Cb is determined depending on the number.

The sense amplifier 20 includes four NMOS transistors Q1, Q2, Q3 and Q4. The NMOS transistors Q3 and Q1 are connected in series between the global bit line GBL and a ground potential VSSSA. The NMOS transistor Q1 (the first transistor of the invention) has a gate connected to the local bit line LBL and amplifies a signal voltage of the local bit line LBL to convert it into a drain current. The NMOS transistor Q3 (the second transistor of the invention) controls a connection state between the drain of the NMOS transistor Q1 and the global bit line GBL in response to the control signal RT applied to its gate.

Two NMOS transistors Q4 and Q2 are connected in series between the global bit line GBL and the ground potential VSSSA, and an intermediate node therebetween is connected to the local bit line LBL. The NMOS transistor Q2 (the first precharge circuit of the invention) precharges the local bit line LBL in response to a precharge signal PC (the first precharge signal of the invention) applied to its gate. When the precharge signal PC is controlled to be "High", the local bit line LBL is precharged to the ground potential VSSSA. The NMOS transistor Q4 controls a connection state between the local bit line LBL and the global bit line GBL in response to a control signal WT applied to its gate.

Meanwhile, the global sense amplifier 21 includes three P-channel type MOS (Hereinafter, referred to as PMOS) transistors Q10, Q13 and Q15 and four NMOS transistors Q11, Q12, Q14 and Q16. The PMOS transistor Q10 (the second precharge circuit of the invention) is connected between a supply voltage VARY and the global bit line GBL and precharges the global bit lines GBL in response to a precharge signal PCG (the second precharge signal of the invention) applied to its gate. When the precharge signal PCG is controlled to be "Low", the global bit line GBL is precharged to the supply voltage VARY. The NMOS transistor Q11 controls a connection state between the global bit line GBL and a node N1 in response to the control signal LTC applied to its gate. The NMOS transistor Q12 controls a connection state between the global bit line GBL and a node N2 in response to a control signal RES applied to its gate.

Two PMOS transistors Q13 and Q15 and two NMOS transistors Q14 and Q16 forms a latch circuit which detects and latches a binary signal voltage transmitted to the global bit line GBL. The PMOS transistor Q13 and the NMOS transistor Q14 which form a sensing inverter having a relatively large driving force have gates connected to the node N1. The PMOS transistor Q15 and the NMOS transistor Q16 which form a latching inverter having a relatively small driving force have gates connected to the node N2. Inputs and outputs of these two inverters are cross-coupled to each other, and the supply voltage VARY and the ground potential VSS are supplied thereto.

Further, four NMOS transistors Q17, Q18, Q19 and Q20 are provided between the global sense amplifier 21 and the read and write buses RBUS and WBUS. Two NMOS transistors Q17 and Q18 used for a read operation are connected in series between the read bus RBUS and the ground potential VSS, and two NMOS transistors Q19 and Q20 used for a write operation are connected in series between the node N1 and the write bus WBUS. The gate of the NMOS transistor Q17 is connected to the node N2, a control signal WE is applied to the gate of the NMOS transistor Q19, and a column select signal YS is commonly applied to gates of the NMOS transistors Q18 and Q20.

In the read operation, the control signal LTC is controlled to be "High" and the column select signal YS is controlled to be "Low", and an output signal appearing at the node N2 is inputted to the gate of the NMOS transistor Q17 and outputted to the read bus RBUS through the series connected NMOS transistors Q17 and Q18. In a restore operation after the read operation of the memory cell MC, the control signal LTC is controlled to be "Low" and the control signal RES is controlled to be "High", and the output signal of the node N2 is outputted to the global bit line GBL through the NMOS transistor Q12. Meanwhile, in the write operation, the column select signal YS is controlled to be "High" and the control signal WE is controlled to be "High", and write data is inputted from the write bus WBUS. This write data reaches the node N1 through the NMOS transistors Q20 and Q19, and after being inverted by the above sensing inverter, the write data is outputted to the global bit line GBL through the MOS transistor Q12.

Next, a specific circuit configuration of the delay circuit 14 shown in FIG. 1 will be described. The delay circuit 14 of the embodiment includes a first delay circuit 14a outputting the control signal RT supplied to the sense amplifier 20 and a second delay circuit 14b outputting the control signal LTC supplied to the global sense amplifier 21. In the following, respective circuit configuration examples of the first and second delay circuits 14a and 14b included in the delay circuit 14 will be described with reference to FIGS. 3 and 4.

Figure 3:
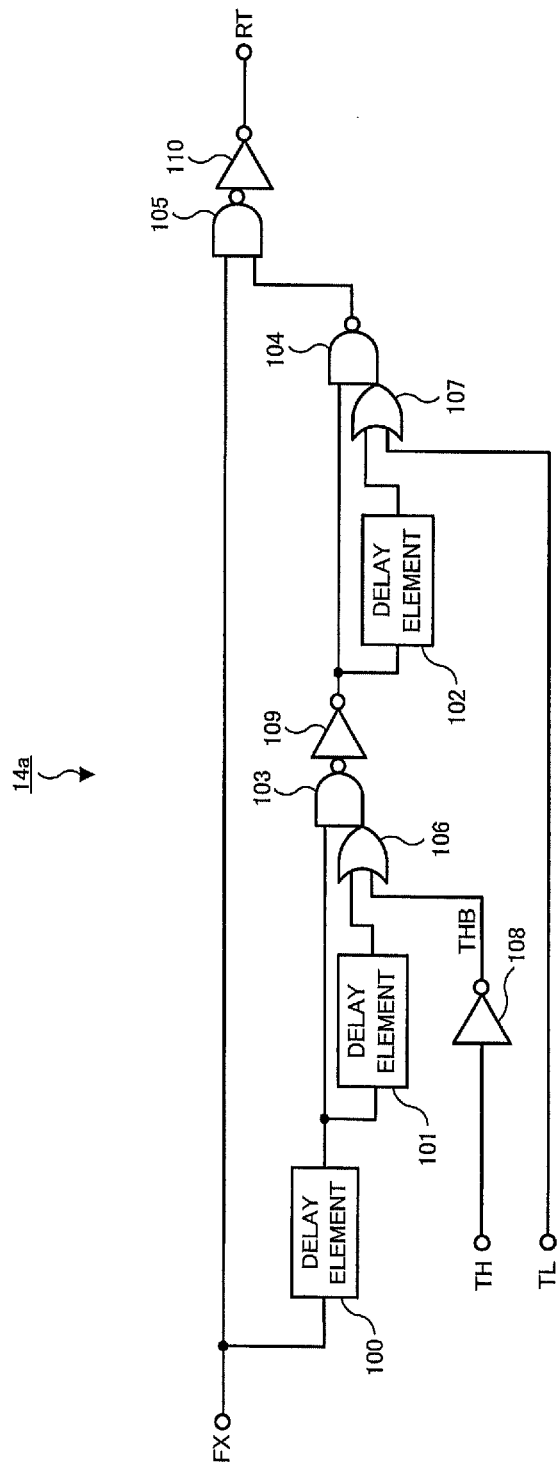
FIG. 3 is diagrams showing a circuit configuration example of a first delay circuit 14a included in a delay circuit 14.

As shown in FIG. 3, the first delay circuit 14a outputting the control signal RT includes three delay elements 100 to 102, three NAND gates 103 to 105, two OR gates 106, 107, and three inverters 108 to 110. The delay element 100 receives the word line driving signal FX and outputs the signal after delaying it by a first delay time. The delay element 101 further delays an output signal of the delay element 100 by a second delay time and outputs it. The OR gate 106 receives an output signal of the delay element 101 and an inverted signal THB of the temperature detection signal TH via the inverter 108. Then, the NAND gate 103 receives the output signal of the delay element 100 and an output signal of the OR gate 106, and further an output signal of the NAND gate 103 is inverted via the inverter 109. The delay element 102 delays an inverted signal of the NAND gate 103 by a third delay time and outputs it. The OR gate 107 receives an output signal of the delay element 102 and the temperature detection signal TL. The NAND gate 104 receives an inverted signal of the NAND gate 103 and an output signal of the OR gate 107. Then, the NAND gate 105 receives the word line driving signal FX and an output signal of the NAND gate 104, and further an output signal of the NAND gate 105 is inverted by the inverter 110. In the first delay circuit 14a, an inverted signal of the NAND gate 105 is outputted as the control signal RT as described above.

The configuration of FIG. 3 allows the control signal RT to rise at the same timing as the word line driving signal FX. Meanwhile, the falling timing of the control signal RT changes in accordance with enabled states of the temperature detection signals TL and TH. That is, when the temperature detection signal TL becomes enabled (High) at the low temperature, the control signal RT falls after the first delay time of the delay element 100 elapses. When the temperature detection signal TH becomes enabled (High) at the high temperature, the control signal RT falls after a delay time obtained by adding the first, second and third delay times of the three delay elements 100 to 102 elapses. Further, at the ordinary temperature (The temperature detection signals TH and TL are both at "Low"), the control signal RT falls after a delay time obtained by adding the first and third delay times of the delay elements 100 and 102 elapses. Thus, by appropriately setting the respective delay times of the delay elements 100 to 102, the activation period of the sense amplifier 20 can be adjusted so as to adapt to the temperature based on the control signal RT.

Figure 4:
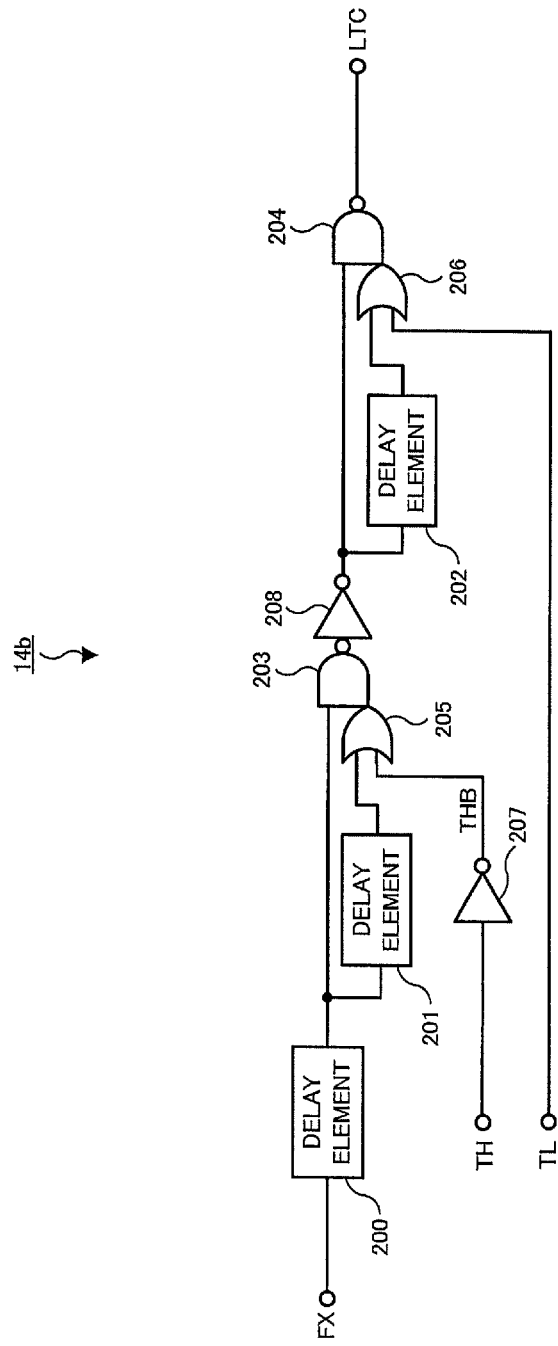
FIG. 4 is diagrams showing a circuit configuration example of a second delay circuit 14b included in a delay circuit 14.

Next, as shown in FIG. 4, the second delay circuit 14b outputting the control signal LTC includes three delay elements 200 to 202, two NAND gates 203, 204, two OR gates 205, 206, and two inverters 207, 208. The delay element 200 receives the word line driving signal FX and outputs the signal after delaying it by a fourth delay time. The delay element 201 receives an output signal of the delay element 200 and outputs the signal after further delaying it by a fifth delay time. The OR gate 205 receives an output signal of the delay element 201 and an inverted signal of the temperature detection signal TH via the inverter 207. Then, the NAND gate 203 receives the output signal of the delay element 200 and an output signal of the OR gate 205, and further an output signal of the NAND gate 203 is inverted via the inverter 208. The delay element 202 outputs the inverted signal of the NAND gate 203 after delaying it by a sixth delay time. The OR gate 206 receives an output signal of the delay element 202 and the temperature detection signal TL. The NAND gate 204 receives an inverted signal of the NAND gate 203 and an output signal of the OR gate 206. In the second delay circuit 14b, an inverted signal of the NAND gate 204 is outputted as the control signal LTC as described above.

The configuration of FIG. 4 allows the falling timing of the control signal LTC to change in accordance with the enabled states of the temperature detection signals TL and TH. That is when the temperature detection signal TL becomes enabled (High) at the low temperature, the control signal LTC falls after the fourth delay time of the delay element 200 elapses.

When the temperature detection signal TH becomes enabled (High) at the high temperature, the control signal LTC falls after a delay time obtained by adding the fourth, fifth and sixth delay times of the three elements 200 to 202 elapses. Further, at the ordinary temperature (The temperature detection signals TH and TL are both at "Low"), the control signal LTC falls after a delay time obtained by adding the fourth and sixth delay times of the two delay elements 200 and 202 elapses. Thus, by appropriately setting the respective delay times of the delay elements 200 to 202, the activation period of the global sense amplifier 21 can be adjusted so as to adapt to the temperature based on the control signal LTC.

Figure 5:
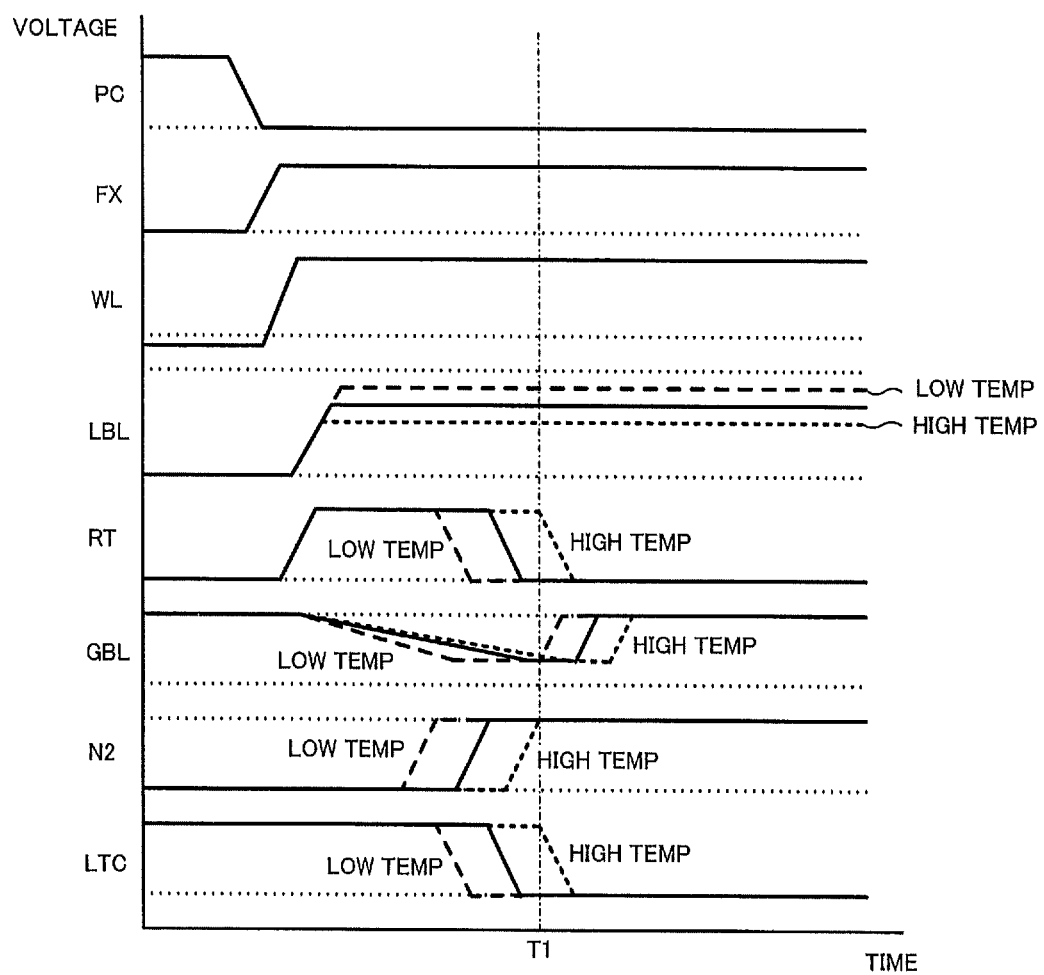
FIG. 5 is a diagram explaining an operation of the DRAM when an ACT command is inputted thereto.
Figure 6:
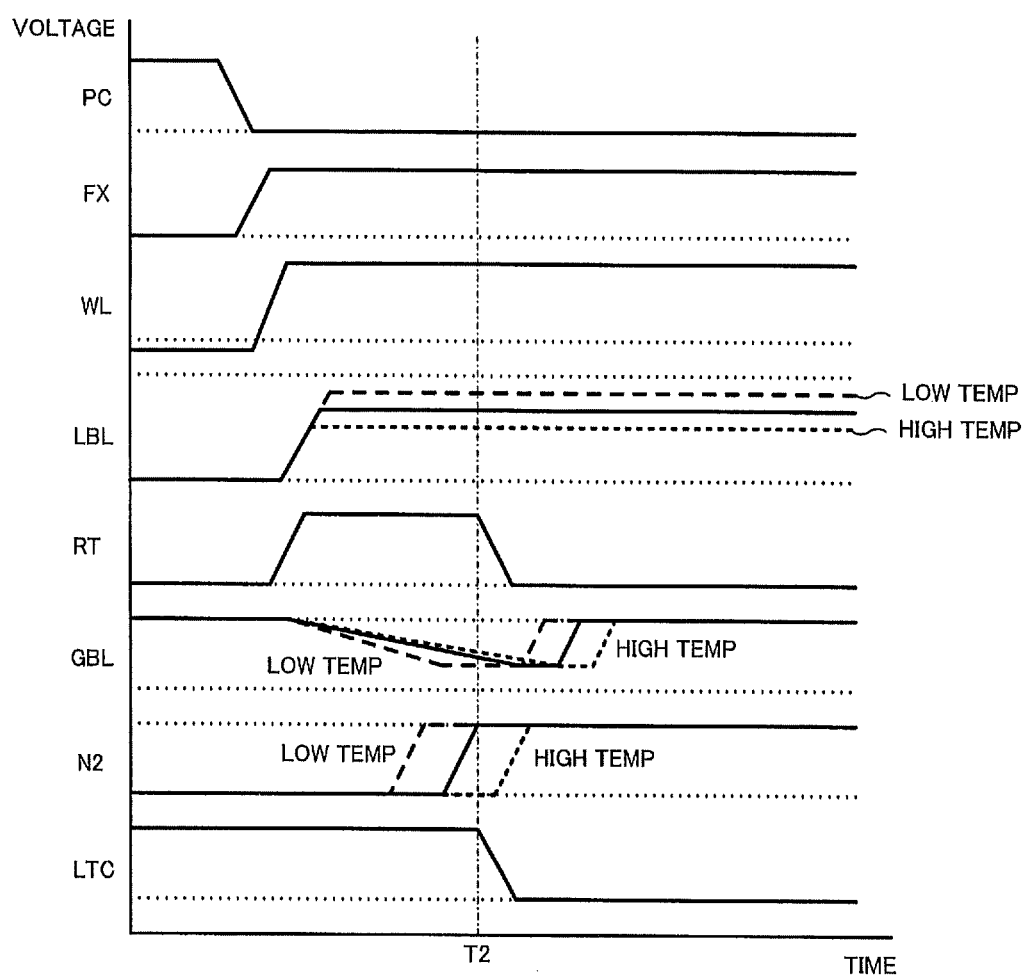
FIG. 6 is a diagram showing operation waveforms in the conventional configuration when the ACT command is inputted thereto in which temperature compensation control of the embodiment is not adapted, for the purpose of comparing with FIG. 5.

An operation of the DRAM of the embodiment will be described with reference to FIGS. 5 and 6. FIG. 5 is a diagram showing operation waveforms when an ACT command is inputted to the DRAM having the configuration of FIGS. 1 to 4. FIG. 6 is a comparison diagram showing operation waveforms when the ACT command is inputted in the conventional configuration to which the temperature compensation control of the embodiment is not adapted, for the purpose of comparing with FIG. 5. In FIGS. 5 and 6, the operation in case of reading "High" data stored in the memory cell MC is described.

In an early period of FIG. 5, the local bit line LBL has been precharged to the ground potential VSSSA, and when the ACT command is inputted to the DRAM from outside, the precharge signal PC is controlled to be "Low" so that the precharging of the local bit line LBL is cancelled. Subsequently, the word line driving signal FX is controlled to be "High". Thereby, a selected word line WL in the memory cell array 10 is driven, and "High" data stored in the memory cell MC is read out to the local bit line LBL. At this point, the potential of the local bit line LBL rises to a potential determined by a ratio of a capacitance of the capacitor Cs and a parasitic capacitance of the local bit line LBL, and thereby the transistor Q1 of the sense amplifier 20 turns on.

Meanwhile, the word line driving signal FX inputted to the first delay circuit 14a allows the control signal RT to be "High". At this point, by controlling the precharge signal PCG (FIG. 2) to be "High", the charge of the global bit line GBL which has been precharged to the supply voltage VARY is extracted to the ground potential VSSSA through transistors Q3 and Q1 of the sense amplifier 20. Then, when the potential at the node N1 (FIG. 2) of the global sense amplifier 21 becomes lower than the logical threshold voltage of the global sense amplifier 21, the potential at the node N2 of the global sense amplifier 21 is inverted from "Low" to "High", as shown in FIG. 5, and the "High" data of the memory cell MC is read out by the global sense amplifier 21.

As shown in FIG. 5, the high potential of the local bit line LBL and a potential at which the global bit line GBL changes from "High" to "Low" both have a temperature dependence. In the memory cell MC, when junction leak of the stored charge in the capacitor C0 increases with a rise in temperature, and correspondingly the stored charge in the memory cell MC for reading the "High" data decreases. Thus, the potential of the local bit line LBL decreases at the high temperature and increases at the low temperature, in comparison with that at the ordinary temperature (solid line). Further, when the potential of the local bit line LBL decreases with a rise in temperature, the current ability of the transistor Q1 of the sense amplifier 20 becomes lower, and therefore the extraction of the charge of the global bit line GBL is slowed. Thus, when the global bit line GBL changes from "High" to "Low", the potential change thereof becomes gentle at the high temperature and becomes steep at the low temperature, in comparison with that at the ordinary temperature (solid line). That is, a time required for the potential at the node N2 of the global sense amplifier 21 to stabilize to "Low" becomes longer with the rise in temperature.

In the embodiment, in accordance with the above temperature dependence, changing timings of the control signals RT and LTC from "High" to "Low" are appropriately controlled based on delay times set in the first and second delay circuits 14a and 14b respectively. That is, although the control signals RT and LTC change from "High" to "Low" almost simultaneously at the ordinary temperature, the signals are controlled to change from "High" to "Low" at timing T1 at the high temperature, which is later than that at the ordinary temperature, and the signals are controlled to change from "High" to "Low" at an earlier timing at the low temperature. Consequently, regardless of the temperature, latch timing can be appropriately controlled so that the control signals RT and LTC fall after the potential of the global bit line GBL decreases and allows the latch data in the global sense amplifier 21 to be determined. Thus, false latching in the global sense amplifier 21 in a read operation of the "High" data can be reliably prevented.

On the other hand, operations in the comparison diagram of FIG. 6 are different in accordance with the temperature dependence. As shown in FIG. 6, when the ACT command is inputted, waveforms of the precharge signal PC, the word line driving signal FX, the word line WL, the local bit line LBL, the global bit line GBL, and the node N2 of the global sense amplifier 21 have waveforms common to those of FIG. 5, so description thereof will be omitted. In the comparison diagram of FIG. 6, it is different from FIG. 5 that temperature compensation control for the control signals RT and LTC is not performed. That is, timing T2 at which the control signal RT changes from "High" to "Low" is fixed regardless of the temperature, and the latch data in the global sense amplifier 21 is determined before the timing T2 at the low or ordinary temperature, which is understood to be indeterminable at the timing T2 at the high temperature. Therefore, it is inevitable that false latching occurs in the global sense amplifier 21 when reading the "High" data at the low temperature, and margin is not sufficient at the ordinary temperature. By employing the temperature compensation control of the embodiment, the control signals RT and LTC change following the temperature dependence of the latch timing, and thus the false latching does not occur. Further, although there is a problem in the comparison diagram of FIG. 6 that the read margin for the "High" data is smaller than that for the "Low" data, both margins can be kept balanced in FIG. 5.

In the embodiment, an example has been described where the temperature compensation control using the delay circuit 14 and the temperature detection circuit 15 is performed by using the control signal RT supplied to the sense amplifier row 11 and the control signal LTC supplied to the global sense amplifier row 12 respectively. However, the above temperature compensation control can be performed by using either of the control signals RT and LTC. Further, in the embodiment, an example has been described where delay times different from one another at three stage temperatures including the ordinary, low and high temperatures are given to the control signals RT and LTC. However, for example, delay times different from each other at two stage temperatures including the ordinary (or low) and high temperatures may be given to the control signals RT and LTC, and reversely, multi-stage delay times corresponding to divided temperatures may be given to the control signals RT and LTC. Furthermore, in the embodiment, an example of the sense amplifier control circuit including the delay circuit 14 and the temperature detection circuit 15 has been described. However, the above temperature compensation control can be achieved by using sense amplifier control circuits having various configurations without being limited to the above configuration.

Figure 7:
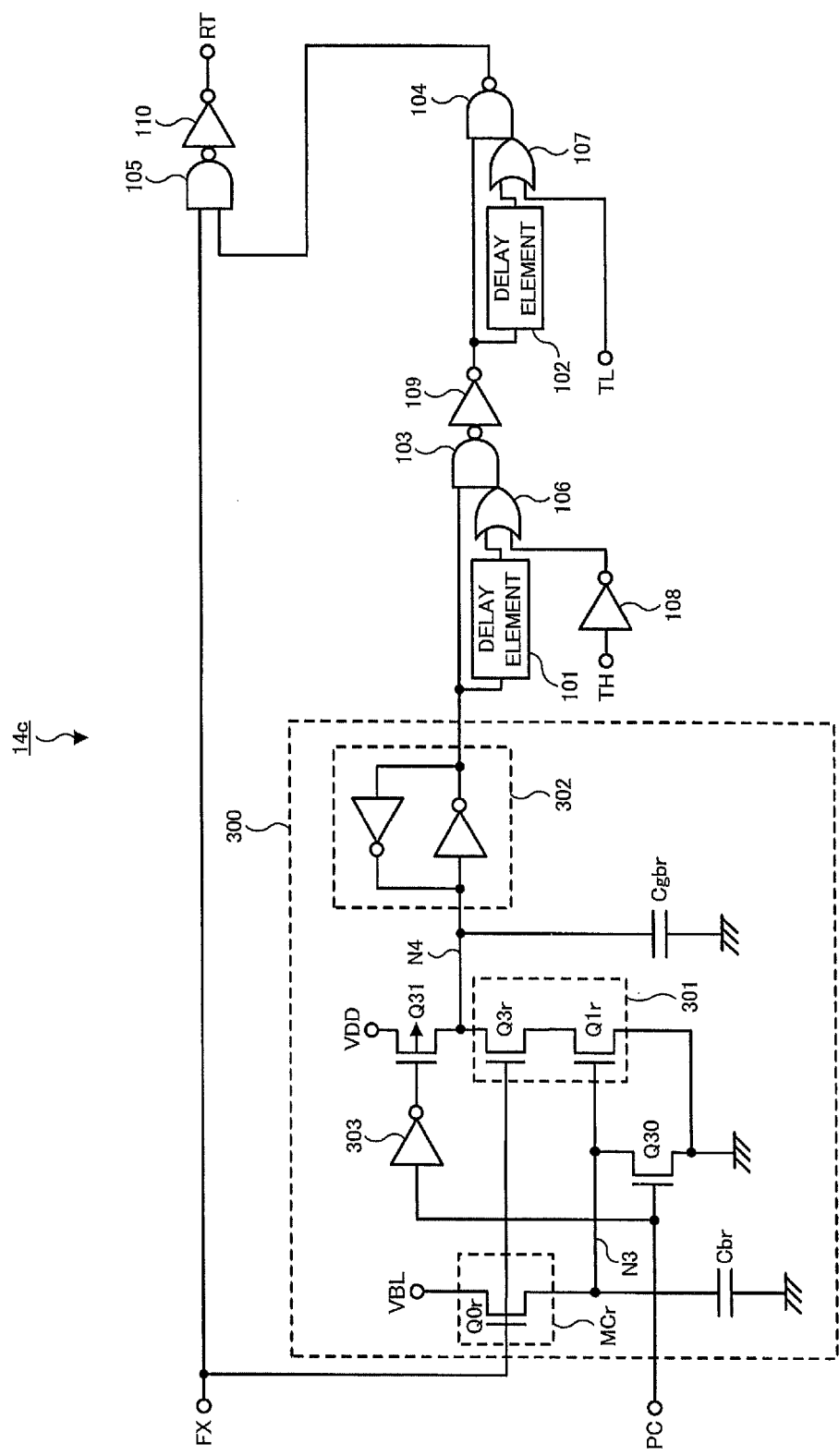
FIG. 7 is a diagram showing a modification of the first delay circuit 14a of FIG. 3.
Figure 8:
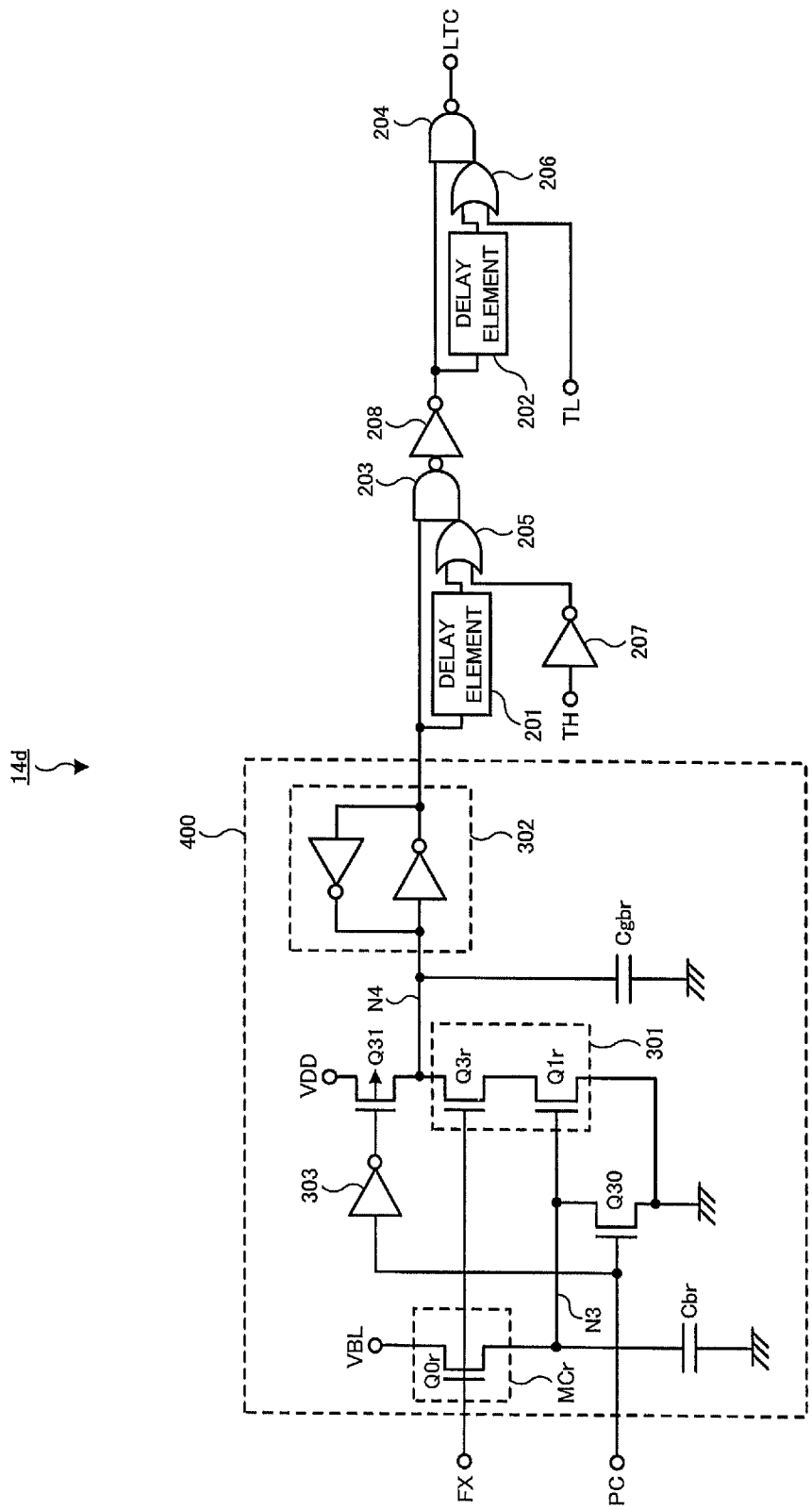
FIG. 8 is a diagram showing a modification of the second delay circuit 14b of FIG. 4.

There are various modifications for the circuit configuration of the delay circuit 14 of the embodiment without being limited to FIGS. 3 and 4. FIG. 7 is a diagram showing a modification of the first delay circuit 14a of FIG. 3, and FIG. 8 is a diagram showing a modification of the second delay circuit 14b of FIG. 4, each of which have a feature that the delay element 100 or 200 is replaced with a replica delay circuit corresponding to the sense amplifier circuit.

As shown in FIG. 7, in the first delay circuit 14c outputting the control signal RT, a part including two delay elements 101, 102, three NAND gates 103 to 105, two OR gates 106, 107, and three inverters 108 to 110 has the same configuration as the first delay circuit 14a of FIG. 3, so description thereof will be omitted. Meanwhile, in the first delay circuit 14c of FIG. 7, a replica delay circuit 300 is provided instead of the delay element 100 of FIG. 3. The replica delay circuit 300 is a circuit providing the same delay characteristics as a hierarchical sense amplifier circuit, and includes a replica memory cell MCr, a replica sense amplifier 301, a replica latch circuit 302, a bit line replica capacitor Cbr, a global bit line replica capacitor Cgbr, an inverter 303, an NMOS transistor Q30 and a PMOS transistor Q31.

A replica transistor Q0r included in the replica memory cell MCr has the same characteristics as the transistor Q0 of the memory cell MC, has a gate to which the word line driving signal FX is applied, and has a source to which the supply voltage VBL is applied. The bit line replica capacitor Cbr has the same capacitance as the bit line capacitance Cb (FIG. 2) formed at the local bit line LBL. The global bit line replica capacitor Cgbr has the same capacitance as a capacitance Cbg (not shown) formed at the global bit line GBL. Two replica transistors Q1r and Q3r included in the replica sense amplifier 301 have the same characteristics as those of the two NMOS transistors Q1 and Q3 in the sense amplifier 20 respectively. The replica latch circuit 302 includes two inverters and operates in the same manner as the latch circuit in the global sense amplifier 21.

In the first delay circuit 14c of FIG. 7, the precharge signal PC is controlled to be "High" in the precharge operation and the word line driving signal FX is simultaneously changed to "Low". Thereby, the NMOS transistor Q30 is turned on so that a node N3 between the replica transistor Q0r and the bit line replica capacitor Cbr is precharged to the ground potential, and the PMOS transistor Q31 is turned on via the inverter 303 so that a node N4 between the PMOS transistor Q31 and the replica sense amplifier 301 is precharged to a supply voltage VDD. The node N3 corresponds to the local bit line LBL and the node N4 corresponds to the global bit line GBL. When the word line driving signal FX becomes "Low", the control signal RT becomes "Low" via the NAND gate 105 and the inverter 110. Further, an output of the replica latch circuit 302 to which the global bit line GBL is connected becomes "Low".

In the read operation, the precharge signal PC is controlled to be "Low", the word line driving signal FX is simultaneously changed to "High", and the control signal RT is immediately changed to "High". Meanwhile, when the word line driving signal FX becomes "High", the replica transistor Q0r of the replica memory cell MCr and the replica transistor Q3r of the replica sense amplifier 301 are both turned on. Thereby, the bit line replica capacitor Cbr is charged by the supply voltage VBL so that the replica transistor Q1r is turned on, and the global bit line replica capacitor Cgbr is discharged to the ground potential. At this point, when the replica latch circuit 302 determines that its input voltage is a low level, output latch data of the replica latch circuit 302 changes to a high level. By providing the replica delay circuit 300, a predetermined delay time associated with the operation of the sense amplifier 20 and the global sense amplifier 21 can be generated, and by combining the delay time with respective delay times of the subsequent delay elements 101 and 102, an appropriate temperature compensated delay time can be given to the control signal RT. In addition, operations in FIG. 7 other than the operation of the replica delay circuit 300 are the same as those in FIG. 3, so description thereof will be omitted.

Further, as shown in FIG. 8, the second delay circuit 14d outputting the control signal LTC includes a replica delay circuit 400, two delay elements 201, 202, two NAND gates 203, 204, two OR gates 205, 206, and two inverters 207, 208. In FIG. 8, configuration and operation of the replica delay circuit 400 are the same as those of the replica delay circuit 300 in FIG. 7, and configurations and operations of other parts are the same as those in FIG. 4, so description thereof will be omitted. By providing the replica delay circuit 400, the above-mentioned appropriate temperature compensated delay time can be given to the control signal LTC.

The DRAM employing the above modifications of FIGS. 7 and 8 can achieve the operation waveforms as in FIG. 5. In this case, it is possible to achieve the effect of preventing the false latching in the global sense amplifier 21 due to an increase of the leak in the memory cell MC, and the effect of balancing the read margins for the "High" and "Low" data. Additionally, it is possible to achieve the temperature compensation control reflecting accurate delay times which are unaffected by fluctuation of threshold voltages of transistors included in the sense amplifier 20 and the global sense amplifier 21 by using the replica delay circuits 300 and 400.

In the foregoing, the preferred embodiment of the present invention has been described. However the present invention is not limited to the above embodiment and can variously be modified without departing the essentials of the present invention, and the present invention obviously covers the various modifications. That is, the present invention covers the various modifications which those skilled in the art can carry out in accordance with all disclosures including claims and technical ideas. For example, in the embodiment, although the configuration of the DRAM as the semiconductor device has been described, the present invention is not limited to the DRAM, and can be applied to various semiconductor devices such as CPU (Central Processing Unit), MCU (Micro Control Unit), DSP (Digital Signal Processor), ASIC (Application Specific Integrated Circuit), ASSP (Application Specific Standard Product) and the like. Further, the present invention can be applied to various devices such as SOC (System on Chip), MCP (Multi Chip Package) and POP (Package on Package) and the like.

What is claimed is:
1. A semiconductor device comprising:
a memory cell;
a first bit line coupled to the memory cell;
a second bit line;
a first sense amplifier circuit including first and second transistors, the first transistor including a gate coupled to the first bit line, and the first and second transistors are coupled in series between the second bit line and a first voltage line;
a temperature detection circuit configured to detect a temperature of the semiconductor device; and a control circuit configured to receive an output of the temperature detection circuit and supply a control signal to a gate of the second transistor.

2. The semiconductor device as claimed in claim 1, further comprising a second sense amplifier circuit including an amplifying circuit and a third transistor, the amplifying circuit and the third transistor being coupled in series between the second bit line and a second voltage line, the amplifying circuit amplifying at least data of the memory cell, the control circuit being configured to supply an additional control signal to the third transistor.

3. The semiconductor device as claimed in claim 2, further comprising a fourth transistor coupled between a precharge voltage line supplied with a precharge potential and the second bit line, the fourth transistor taking an on-state when at least one of the second and third transistors takes an off-state.

4. The semiconductor device as claimed in claim 3, wherein the memory cell includes a memory element and a fifth transistor, the memory element and the fifth transistor are coupled in series between a third voltage line and the first bit line, the first, second, third and fifth transistors being same in conductivity type as each other, and the fourth transistor being different in conductivity type from each of the first, second, third and fifth transistors.

5. The semiconductor device as claimed in claim 4, wherein each of the first, second, third and fifth transistors is an N-conductivity type transistor and the fourth transistor is a P-conductivity type transistor.

6. The semiconductor device as claimed in claim 3, wherein the fourth transistor takes an on-state when each of the second and third transistors takes an off-state, and taking an off-state when each of the second and third transistors takes an on-state.

7. The semiconductor device as claimed in claim 2, wherein the control circuit includes:
a circuit node;
an additional circuit node coupled to a gate of the third transistor; and
a delay circuit coupled between the circuit node and the additional circuit node, the delay circuit being configured to receive the output of the temperature detection circuit.

8. The semiconductor device as claimed in claim 7, wherein the control circuit further includes a replica circuit provided correspondingly to the first sense amplifier circuit, the replica circuit being coupled between the circuit node and the additional circuit node in series with the delay circuit.

9. The semiconductor device as claimed in claim 2, wherein the third transistor coupled between the second bit line and the amplifying circuit.

10. The semiconductor device as claimed in claim 1, wherein the second transistor maintains an on-state during an first logic period of the control signal, the first logic period of the control signal being changed in response to the output of the temperature detection circuit.

11. The semiconductor device as claimed in claim 10, wherein the output of the temperature detection circuit makes the first logic period of the control signal longer when the temperature of the semiconductor device rises.

12. The semiconductor device as claimed in claim 1, wherein the first and second transistors are same in conductivity type as each other.

13. The semiconductor device as claimed in claim 12, wherein each of the first and second transistors is N-conductivity type transistor.

14. The semiconductor device as claimed in claim 12, further comprising a sixth transistor coupled between a second precharge voltage line supplied with a second precharge potential and the first bit line, the first, second and sixth transistors are same in conductivity type as each other.

15. The semiconductor device as claimed in claim 12, wherein the memory cell includes a memory element and a fifth transistor coupled between the memory element and the first bit line, the first, second and fifth transistors are same in conductivity type as each other.

16. The semiconductor device as claimed in claim 1, wherein the control circuit includes:
a circuit node;
a gate circuit including a first input node coupled to the circuit node, a second input node and an output node coupled to a gate of the second transistor; and
a delay circuit coupled between the circuit node and the second input node of the gate circuit, the delay circuit being configured to receive the output of the temperature detection circuit.

17. The semiconductor device as claimed in claim 16, wherein the control circuit further includes a replica circuit provided correspondingly to the first sense amplifier circuit, the replica circuit being coupled between the circuit node and the second input node of the gate circuit in series with the delay circuit.

18. The semiconductor device as claimed in claim 1, wherein the first bit line is a local bit line and the second bit line is a global bit line.

19. A semiconductor device comprising:
a memory cell;
a local bit line coupled to the memory cell;
a global bit line;
a local sense amplifier circuit including first and second transistors, the first transistor including a gate coupled to the local bit line, and the second transistor being provided between the global bit line and the first transistor;
a temperature detection circuit configured to detect a temperature of the semiconductor device; and
a control circuit configured to receive an output of the temperature detection circuit and supply a control signal to a gate of the second transistor,
the control circuit that includes a first replica circuit provided correspondingly to the local sense amplifier circuit.

20. The semiconductor device as claimed in claim 19, wherein the control circuit further includes a second replica circuit provided correspondingly to the memory cell.

* * * * *